(12) United States Patent
Middelman et al.

(10) Patent No.: US 6,951,770 B2
(45) Date of Patent: Oct. 4, 2005

(54) METHOD OF MANUFACTURING A PHOTOVOLTAIC FOIL

(75) Inventors: Erik Middelman, Arnhem (NL); Gert Jan Jongerden, Velp (NL)

(73) Assignee: Akzo Nobel N.V., Arnhem (NL)

( * ) Notice: Subject to any disclaimer, the term of this patent is extended or adjusted under 35 U.S.C. 154(b) by 258 days.

(21) Appl. No.: 10/240,632

(22) PCT Filed: Mar. 28, 2001

(86) PCT No.: PCT/EP01/03715
§ 371 (c)(1),
(2), (4) Date: Feb. 24, 2003

(87) PCT Pub. No.: WO01/78156
PCT Pub. Date: Oct. 18, 2001

(65) Prior Publication Data
US 2003/0160243 A1 Aug. 28, 2003

(51) Int. Cl.[7] ............................................. H01L 31/04
(52) U.S. Cl. ..................... 438/57; 438/66; 438/482; 438/678; 136/243; 136/258
(58) Field of Search .................... 438/56–57, 65–67, 438/482, 678; 136/243–265

(56) References Cited

U.S. PATENT DOCUMENTS

| | | | |
|---|---|---|---|
| 4,341,610 A | 7/1982 | Schumacher | 204/206 |
| 4,388,483 A | 6/1983 | Basol et al. | 136/260 |
| 4,440,244 A | 4/1984 | Wiredal | 175/292 |
| 4,456,630 A | 6/1984 | Basol | 427/88 |
| 4,816,120 A | 3/1989 | Ondris et al. | 204/37.1 |
| 5,232,860 A | 8/1993 | Kawanishi et al. | 437/2 |
| 5,472,910 A | 12/1995 | Johnson et al. | 437/185 |
| 5,804,466 A | 9/1998 | Arao et al. | 438/95 |
| 6,117,703 A | 9/2000 | Penndorf | 438/63 |
| 6,452,090 B2 * | 9/2002 | Takato et al. | 136/255 |

FOREIGN PATENT DOCUMENTS

| | | | |
|---|---|---|---|
| WO | 98/13882 | 4/1998 | ....... H01L/31/0392 |

OTHER PUBLICATIONS

R. P. Raffaelle et al., "Electrodeposited CdS on CIS pn Junctions" Solar Energy Materials & Solar Cells 57 (1999) 167–178.
G. C. Morris et al., "Solar Cells from Thin Films Prepared by Periodic Pulse Electrodeposition", Applied Surface Science 92 (1996) 630–634.
S.K. Das, Preparation and Characterisation of Electrodeposited n–CdS/p–CdTe Thin Film Solar Cells, Solar Energy Materials & Solar Cells 28 (1993) 305–316.
"Photovoltaic Cells", Ullmann's Encyclopedia of Industrial Chemistry, vol. A20 (1992), p. 161.
"Solar Technology", Ullmann's Encyclopedia of Industrial Chemistry, vol. A24 (1993), p. 369.
G.C. Morris et al., "Camdium Sulphide Films Prepared by Pulsed Electrodeposition", Solar Energy Materials and Solar Cells 27 (1992) 305.

* cited by examiner

Primary Examiner—H. Jey Tsai
(74) Attorney, Agent, or Firm—Richard P. Fennelly; Louis A. Morris

(57) ABSTRACT

The invention pertains to a method of manufacturing a photovoltaic foil comprising a TCO layer, a photovoltaic layer, and a back electrode, which method comprises the following steps: providing a conductive temporary substrate; applying a TCO layer on the temporary substrate; applying a photovoltaic layer on the TCO by means of electrodeposition, with the current during the electrodeposition being supplied at least through the temporary substrate; applying a back electrode; if so desired, applying a permanent substrate; removing the temporary substrate. The crux of the invention is that the unit of the conductive temporary substrate and the TCO functions as electrode during the electrodeposition of the photovoltaic layer. Because of this, the rate of deposition of the photovoltaic layer can be increased compared with that of the prior art. Furthermore, a photovoltaic layer with a more homogenous layer thickness is obtained.

12 Claims, 2 Drawing Sheets

METHOD OF MANUFACTURING A PHOTOVOLTAIC FOIL

Figure 1:
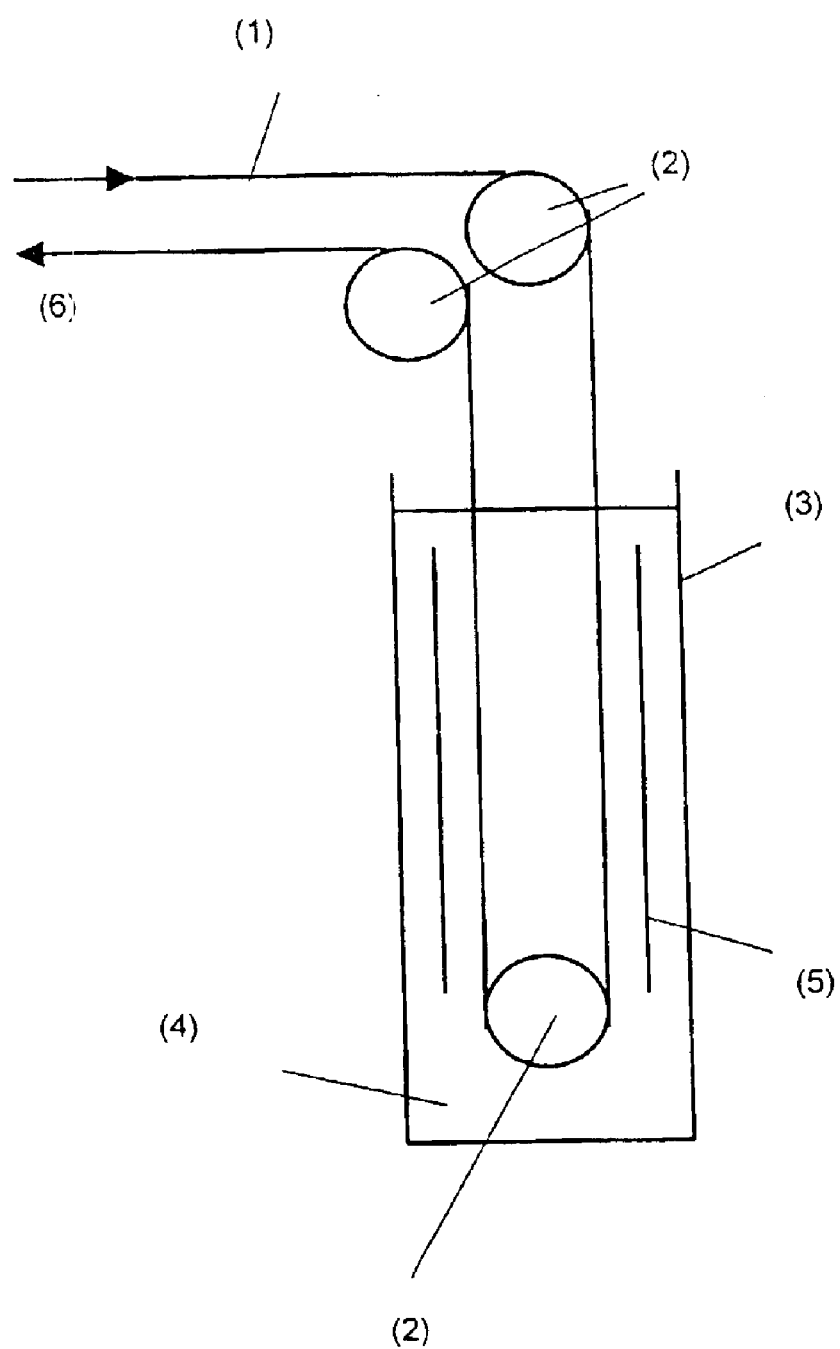

The present invention is a national phase filing of PCT International Patent Application No. PCT/EP01/03715, filed on Mar. 28, 2001, which claims priority from Dutch Patent Application No. 1014857, filed Apr. 6, 2000.

The invention pertains to a method of manufacturing a photovoltaic foil, more particularly a photovoltaic foil where the photovoltaic layer has been applied by means of electrodeposition.

Thin film solar cell foils, also known as photovoltaic foils, generally comprise a carrier and a photovoltaic (PV) layer composed of a semiconductor material provided between a front electrode comprising a transparent conductive oxide (TCO) (at the front of the foil) and a back electrode (at the back of the foil). The front electrode is transparent, enabling incident light to reach the semiconductor material, where the incident radiation is converted into electric energy. In this way light can be used to generate electric current, which offers an interesting alternative to, say, fossil fuels or nuclear power.

In the manufacture of photovoltaic foils generally use is made of vacuum deposition processes. These processes usually are more expensive than comparable processes carried out under atmospheric conditions. For that reason it is desired to manufacture the active layers under moderate process conditions at atmospheric pressure. This can be achieved, e.g., by means of electrochemical deposition of the semiconductor layers. Such processes are known, int. al., from U.S. Pat. No. 4,816,120 and G. C. Morris and R. Vanderveen, *Sol. Energy Mater. Sol. Cells* 27 (1992) 305. Galvanic (electrochemical) deposition, from now on also called electrodeposition, requires that the layer on which the deposition takes place is electrically conductive.

One method for effecting this is using a metallic substrate in the preparation of the solar cell sheet. Such processes are described in U.S. Pat. No. 4,341,610 and DE 196 34 580. The metallic substrate functions simultaneously as substrate and as back electrode. The photovoltaic foils prepared by this method comprise a metal substrate, a photovoltaic layer applied by electrodeposition, and a transparent conductive oxide (TCO) as front electrode. However, the order of first applying the PV layers and then the transparent conductor layer imposes serious limits on the transparent conductor materials used. E.g., a very favourable transparent electrode layer is F-doped tin oxide. However, in order for this to have the desired properties and texture, it should preferably be applied at a temperature of at least 400° C. Such a high temperature may be devastating to the PV layers, int. al. as a result of crystallisation, diffusion of dopants if present, diffusion of impurities, crack formation, and/or loss of hydrogen.

A further method for using electrodeposition to deposit the photovoltaic layers is deposition on glass provided with a layer of a transparent conductive oxide (TCO). Raffaelle et al. (R. P. Raffaelle et al., Electrodeposited CdS on CIS pn junctions, Solar Energy Material & Solar Cells 57 (1999) 167–178) describes the subsequent electrodeposition of CIS and CdS on indium tin oxide coated glass.

Das et al. (S. K. Das and G. C. Morris, Preparation and characterisation of electrodeposited n-CdS/p-CdTe thin film solar cells, Solar Energy Material & Solar Cells 28 (1993) 305–316) describes the subsequent electrodeposition of CdS and CdTe on indium tin oxide coated glass. In the electrodeposition of cadmium telluride the TCO with the CdS buffer layer provided thereon is used as electrode. However, a major drawback to these processes is the low rate of growth of the photovoltaic layers. The rate of growth is limited by the low conduction of the TCO, for the required electrons have to be transported through this layer. Because of the thickness of this layer, typically <1 micron, the resistance is high. This in turn means that the rate of growth is dependent on the distance from the electric contacts provided. Differences in the rate of growth lead to variations in the final layer thickness of the photovoltaic layer, which is undesirable.

Attempts have been made to resolve the problem of the low deposition rate by providing electric conductors with low resistance, such as metals, on or beneath the TCO in the form of stripes. This makes it possible to employ larger panels while maintaining a more or less acceptable rate of growth. The drawback to this approach, however, is that the conductors cast a shade on the active layers, causing a decrease in the current-to-unit area ratio of the modules. Furthermore, in this case the rate of deposition is dependent on the distance from the electric conductors, resulting in a photovoltaic layer of inhomogeneous thickness. According to yet another method, first a thin layer of conductive metal is applied on the TCO. This will improve conduction to a certain extent, but because the layer of conductive metal impedes the incident light, it also leads to a reduction of the amount of light in the cell, and hence to a reduction of the amount of current generated.

Consequently, there is need for a method of manufacturing a photovoltaic foil where the photovoltaic layer can be applied homogeneously at a high rate of deposition by means of electrodeposition, and wherein the nature of the TCO can be selected independently from the nature of the photovoltaic layers.

It was found that this problem can be resolved by applying the TCO on an electrically conductive temporary substrate and supplying the current for the electrodeposition at least through the temporary substrate. As a result, the unit of temporary substrate and TCO will act as electrode during the electrodeposition of the PV layer. Obviously, the TCO and the temporary substrate should be in good ohmic contact. Because the substrate is much thicker than the TCO and generally has a far superior conductivity, the amount of current supplied to the system of substrate and TCO can be increased compared with the prior art. This increases the maximum deposition rate that can be used to obtain a homogeneous photovoltaic layer. As a result of the high conductivity of the substrate, the potential of the TCO is essentially the same across the entire surface. As a result of this, a PV layer of homogeneous thickness is deposited. Because the TCO is deposited on the temporary substrate, and not on the photovoltaic layer, the TCO can be selected independently from the nature of the photovoltaic layer.

The invention therefore pertains to a method comprising the following steps:
  providing a conductive temporary substrate
  applying a TCO layer on the temporary substrate under such conditions that the TCO and the temporary substrate are in good ohmic contact
  applying a photovoltaic layer by means of electrodeposition on the TCO layer, with the current for the electrodeposition being supplied at least through the temporary substrate
  applying a back electrode
  if so desired, applying a permanent substrate
  removing the temporary substrate.

The conductive temporary substrate preferably is flexible, enabling the process to be carried out in the form of a roll-to-roll process. The permanent substrate can be rigid or flexible, depending on the application. For most applications, the permanent substrate preferably is flexible also. The process according to the invention is preferably carried out in a continuous process. More preferably, the continuous process is a roll-to-roll process.

An additional advantage of the method according to the invention is as follows: in order to reduce resistance losses in the photovoltaic foil, as well as to reduce losses in the frequently required inverter, the photovoltaic foil is often divided up into individual cells, which are then connected in series. This process entails, int. al., that grooves are provided in the TCO layer. In a system where the TCO is applied on a non-conductive carrier, say, a glass carrier, electrochemical deposition of the photovoltaic layer takes place only on the TCO, and there is no or hardly any deposition in any grooves that may have been provided in the TCO. This makes easy provision of a series connection impossible.

In the process according to the invention, in which a conductive substrate is employed, the photovoltaic layer is also deposited in the grooves in the TCO, as a result of which a simple series connection can be made. The method according to the invention is then carried out as follows: a temporary substrate coated with a TCO with grooves is provided. By means of electrodeposition a photovoltaic layer is applied on the TCO and the grooves provided in it. Grooves or (rows of) holes are provided in the photovoltaic layer next to the grooves in the TCO. Then a back electrode is provided with grooves next to the grooves or (rows of) holes provided in the photovoltaic layer. If so desired, a permanent substrate is provided, after which the temporary substrate is removed.

In an alternative way of providing a series connection in the process according to the invention, first grooves or (rows of) holes are provided in the photovoltaic layer. Next, a back electrode is provided, in which grooves are made during the deposition, e.g., by using a mask, or afterwards. The PV-foil together with the back electrode is then laminated on a permanent substrate and the temporary substrate is removed. Then, grooves are provided in the TCO with has become accessible with the removal of the temporary substrate, and optionally in the PV layer. The grooves can be provided via methods known as such. These include electro-erosive metal removing, wet etching, dry etching, laser ablation, blasting with an erosive powder or frozen liquid particles, and mechanical scribing with a hard scribing point.

As indicated above, the crux of the present invention is that the unit composed of the conductive temporary substrate and the TCO functions as electrode during the electrodeposition. Because the conductivity of the temporary substrate is higher than that of the TCO, the direction of the current in the TCO will be essentially perpendicular to the substrate layer direction. As a result, the potential of the TCO is essentially homogeneous, resulting in an essentially homogeneous layer thickness of the deposited photovoltaic layer or layers, with a thickness deviation from the mean of usually less than 10%, preferably of less than 5%, more preferably of less than 2%.

An elegant embodiment of the method according to the invention is one in which the temporary substrate with the TCO provided thereon is led over a roller, with the current for the electrodeposition being supplied through said roller. This roller rotates in the electrolyte required for deposition of the PV layer. This results in an extremely homogeneous supply of current to the TCO. Furthermore, the system is of technological interest, since it is suitable for integration in a roll-to-roll-process.

In a different embodiment of the method according to the invention the temporary substrate with provided thereon the TCO is guided via one or more guiding rolls into an electrolyte bath, with the guiding roll or guiding rolls also serving as an electric contact to the foil. Such a set-up makes it possible for deposition to take place at high current density, and hence at high speed. When there are high currents during deposition and large spaces between the contact rolls, there will be a potential (voltage drop or voltage increase) in the machine direction of the foil which may reduce the rate of growth. Carrying out the process continuously in that case turns out to have an additional advantage. Since the potential is only present in the process direction and the foil also moves in this direction, despite the difference in potential a photovoltaic layer of homogeneous thickness will still be formed. A device to practise this process is shown in FIG. 1. In this figure, a temporary substrate provided with a TCO (1) is led via a set of earthed guiding rollers (2) through an electrolyte bath (3) provided with the necessary electrolyte (4). Electrodes (5) provide the necessary current.

In the process according to the invention, the PV layer is applied by way of electrodeposition with the current being supplied through the electrically conductive temporary substrate. If so desired, one or more other layers, such as the TCO, the back electrode, and any optionally present buffer layers may also be applied by way of electrodeposition with the current being supplied through the electrically conductive temporary substrate. In a particularly favoured embodiment of the process according to the invention the TCO, any optionally present buffer layers, the photovoltaic layer, and the back electrode are each applied by electrodeposition in succession in a continuous process with the current being supplied through the electrically conductive temporary substrate.

In a further variation in a first step, the temporary substrate is prepared by way of electrodeposition on a carrier, e.g., a drum or a continuous belt, after which the TCO, any optionally present buffer layers, the photovoltaic layer, and the back electrode are applied by way of electrodeposition to the temporary substrate in succession in a continuous process. Then, the composition comprising the temporary substrate, the TCO, any optionally present buffer layers, the PV layer and the back electrode are removed from the carrier and processed further. An apparatus for carrying out this embodiment is presented in FIG. 2. This figure shows an electrodeposition bath (1), divided into various segments by way of partitions (2). Each segment contains an electrode (3) and the electrolyte (4) required for the specific deposition. An earthed (grounded) drum (5) of, e.g., chromium oxide rotates in the bath. In each section of the bath a layer of the photovoltaic foil is deposited, starting with the temporary substrate, followed by deposition of the TCO, any buffer layers, the PV layer and the back electrode. The system (6) comprising temporary substrate, TCO, optional buffer layers, and back electrode is then removed from the bath to be subjected to the further process steps.

As was indicated earlier, a roll-to-roll process constitutes a preferred embodiment of the method according to the invention. Methods of manufacturing of thin film solar cell sheets using a temporary substrate are known in the art. An especially suitable roll-to-roll process is described in WO 98/13882.

The Temporary Substrate

The temporary substrate has to satisfy a number of conditions. It has to be sufficiently conductive to be able to conduct enough current during the electrodeposition of the photovoltaic layer. It has to be sufficiently heat-resistant to be able to endure the conditions prevailing during the manufacture of the thin film solar cell sheet, more particularly during the deposition of the TCO and the PV layer. It has to be strong enough to be able to carry the thin film solar cell foil during its manufacture. It has to be easy to remove from the TCO layer without damaging the latter. The person skilled in the art will be able to select a suitable temporary substrate within these guidelines.

The temporary substrate employed in the process according to the invention preferably is a foil of a metal or a metal alloy. The principal reasons for this are that such foils exhibit good conductivity, generally are able to withstand high processing temperatures, are slow to evaporate, and are comparatively easy to remove using known etching techniques. Another reason to choose a metal foil, more particularly aluminium or copper, is that in the end the thin film solar cell sheet has to be provided with edge electrodes which have to connect the thin film solar cell sheet to an apparatus or the electricity grid. Pieces of unremoved temporary substrate may be used to this end, as a result of which there is no need for separate provision of the edge electrodes.

Figure 2:
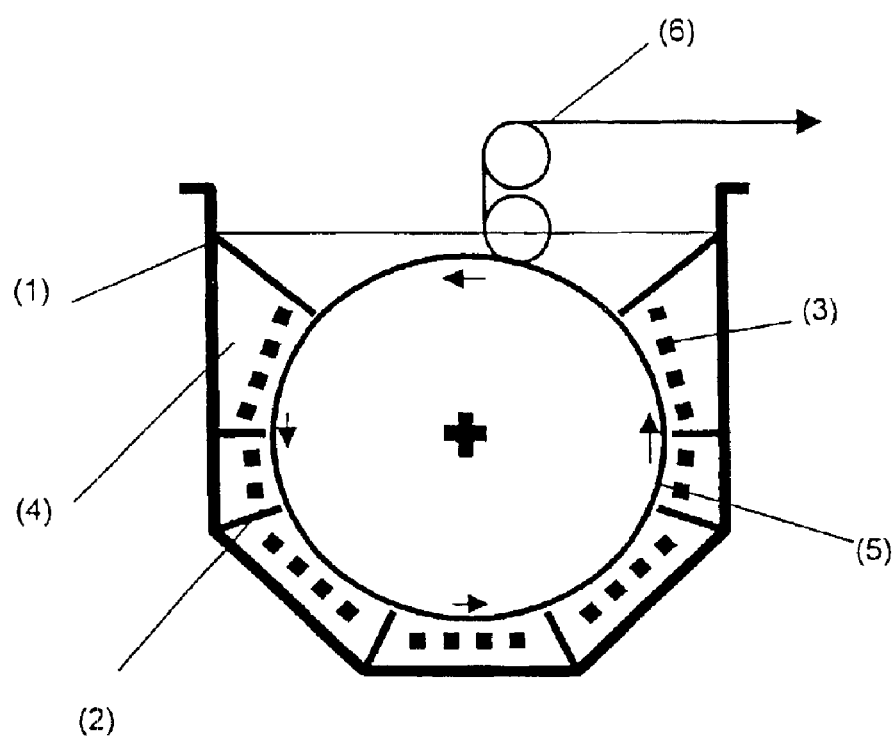

Suitable metals include steel, aluminium, copper, iron, nickel, silver, zinc, molybdenum, chromium, and alloys or multi-layers thereof. For economic reasons among others it is preferred to employ Fe, Al, Cu, or alloys thereof. Given their performance (and taking into account the matter of cost) aluminium, iron, optionally made by electrodeposition, e.g., in the integrated process of FIG. 2, and copper, optionally made by electrodeposition, e.g., in the integrated process of FIG. 2, are preferred most.

Suitable etchants and techniques for removing metals are known, and while they differ per metal, the skilled person will be able to select the appropriate ones. Preferred etchants include acids (both Lewis and Brønstedt acids). Thus in the case of copper it is preferred to use $FeCl_3$, nitric acid or sulphuric acid. Suitable etchants for aluminium are, e.g., NaOH, KOH, and mixtures of phosphoric acid and nitric acid.

If copper, optionally prepared by way of electrodeposition, is used as temporary substrate it is preferred to provide the copper, optionally via electrodeposition, with a non-reducing diffusion barrier layer, e.g., an anti-corrosion layer, more particularly zinc oxide. This is because copper may have the tendency to diffuse through the TCO layer in the PV layer. It is also possible to select a TCO capable of preventing such diffusion, e.g., $SnO_2$ or ZnO. The anti-diffusion layers can be applied by means of for instance electrodeposition, or via Physical Vapour Deposition (PVD) or via Chemical Vapour Deposition (CVD). The anti-diffusion layer generally is removed from the TCO together with the temporary substrate.

For ease of removal, the temporary substrate preferably is as thin as possible. Of course, its thickness has to be such that other layers can be provided on it and it has to be able to hold these together, but this generally does not require it to be more than 500 $\mu$m (0.5 mm) thick. The thickness preferably is in the range of 1 to 200 $\mu$m (0.2 mm). Depending on the modulus of elasticity, the minimum thickness for a large number of materials will be 5 $\mu$m. Accordingly, a thickness of 5–150 $\mu$m, more particularly 10–100 $\mu$m, is preferred.

The TCO Layer

Examples of suitable transparent conductive oxides (TCOs) are indium tin oxide, zinc oxide, zinc oxide doped with aluminium, fluorine, gallium or boron, cadmium sulphide, cadmium oxide, tin oxide, and, most preferably, F-doped $SnO_2$. Said last-mentioned transparent electrode material is preferred, because it can form a desired crystalline surface with a columnar light scattering texture when it is applied at a temperature above 400° C., preferably in the range of 500 to 600° C., or after-treated at said temperature. It is precisely in the case of this TCO material that the use of a temporary substrate capable of withstanding such a high temperature is extremely attractive. In addition, the material is resistant to most etchants and has a better resistance to chemicals than the much-used indium tin oxide. Also, it is far less costly.

The TCO can be applied by means of methods known in the field, e.g., by means of Metal Organic Chemical Vapour Deposition (MCCVD), sputtering, Atmospheric Pressure Chemical Vapour Deposition (APCVD), PECVD, spray pyrolysis, evaporation (physical vapour deposition), electrodeposition, optionally in a process integrated in the electodeposition of the PV layer, electroless plating, screen printing, sol-gel processes, etc. It is preferred to apply and after-treat the TCO layer at a temperature above 250° C., preferably above 400° C., more preferably between 500 and 600° C., so that a TCO layer of the desired composition, properties and/or texture can be obtained.

The Buffer Layer

If so desired, a buffer layer may be present between the TCO layer and the photovoltaic layer. The buffer layer is intended to protect the TCO layer from conditions prevailing during the deposition of the PV layer. The nature of the buffer layer will depend on the nature of the PV layer. Suitable buffer layers for the various PV layers are known in the art. For cadmium telluride CdS, In(OH,S) and Zn(OH,S) may be mentioned.

If in the present specification mention is made of depositing the PV layer on the TCO, a buffer layer may always be present on said TCO.

The Photovoltaic Layer

After application of the TCO layer the photovoltaic (PV) layer is applied by means of electrodeposition. It should be noted here that in the present description the term "PV layer" or "photovoltaic layer" comprises the entire system of layers needed to absorb the light and convert it into electricity. Suitable layer configurations to be applied by means of electrodeposition are known, as are the methods for applying them. For the common general knowledge in this field reference may be had to Yukinoro Kuwano, "Photovoltaic Cells," Ullmann's *Encyclopedia*, Vol.A20 (1992), 161 and "Solar Technology," Ullmann's *Encyclopedia*, Vol.A24 (1993), 369. Processes for electrodepositing photovoltaic layers are described in, e.g., U.S. Pat. No. 4,816,120, U.S. Pat. No. 5,472,910, U.S. Pat. No. 4,440,244, U.S. Pat. No. 4,456,630, and U.S. Pat No. 4,388,483, as well as in, say, G. C. Morris and R. J. Vanderveen, *Applied Surface Science* 92 (1996), 630–634.

For good order's sake it is noted that it is not necessary for all sublayers of the photovoltaic layer to be applied by means of electrodeposition. Cadmium sulphide for instance can be applied by means of, e.g., CVD, immersion, electroless plating, sputtering or vacuum evaporation, followed by the application of cadmium telluride by means of electrodeposition.

Various thin-film semiconductors can be used in the manufacture of the PV layer by means of electrodeposition. Examples are CIS (copper indium diselenide, $CuInSe_2$), $CuInS_2$, cadmium telluride (CdTe), CIGSS (Cu(In,Ga)(Se, S)), $Cu(In,Ga)Se_2$, ZnSe/CIS, ZnO/CIS, and/or Mo/CIS/CdS/ZnO, and dye sensitised solar cells.

The overall thickness of the PV layer generally will be in the range of 100 to 10000 nm, more particularly between about 200 and 6000 nm, preferably between about 250 and 5000 nm, more preferably between about 300 and 1000 nm.

The Back Electrode

The back electrode in the thin film solar cell sheet according to the invention preferably serves both as reflector and as electrode. Generally, the back electrode will have a thickness of about 50 to 500 nm, and it may comprise any suitable material having light reflecting properties, preferably aluminium, silver, or a combination of layers of both, and making good ohmic contact with the subjacent semiconductor layer. Preferably, it is possible to apply the metal layers at a comparatively low temperature, say less than 250° C., by means of, e.g., electrodeposition, (in vacuo) physical vapour deposition or sputtering. In the case of silver, it is preferred to first apply an adhesion promoter layer. $TiO_2$, TiN, ZnO, and chromium oxide are examples of suitable materials for an adhesion promoter layer and have the advantage of also possessing reflecting properties when applied in a suitable thickness, e.g., of 50–100 nm. The required back electrode may be either transparent or opaque The back electrode preferably is applied by electrodeposition, optionally in a process integrated in the electodeposition of the PV layer.

The Permanent Substrate

Although it is not essential to the process according to the invention, as a rule it is preferred to provide the thin film solar cell sheet with a permanent substrate. For, otherwise the thin film will be so thin that its fragility makes for difficult handling. When employed, the permanent substrate is applied on the back electrode. Suitable substrate layer materials include thin films of commercially available polymers, such as polyethylene terephthalate, poly(ethylene 2,6-naphthalene dicarboxylate), polycarbonate, polyvinyl chloride, PVDF, PVDC, or thin films of polymer having very good properties such as aramid or polyimide thin films, but also, for example, metal foils onto which an insulating (dielectric) surface layer may have been applied, or compositions of plastics and reinforcing fibres and fillers. Polymeric "co-extruded" thin films provided with a thermoplastic adhesive layer having a softening point below that of the substrate itself are preferred. If so desired, the co-extruded thin film may be provided with an anti-diffusion layer of, e.g., polyester (PET), copolyester or aluminium. The thickness of the substrate preferably is 50 $\mu$m to 10 mm. Preferred ranges are 75 $\mu$m to 3 mm and 100 $\mu$m to 300 $\mu$m. The bending stiffness of the substrate, defined within the context of this description as the product of the modulus of elasticity E in $N/mm^2$ and the thickness t to the power of three in mm ($Ext^3$), preferably is higher than $16\times10^{-2}$ Nmm and will generally be lower than $15\times10^6$ Nmm.

The substrate may comprise a structure as required for its final use. Thus the substrate may comprise tiles, roofing sheets and elements, facade elements, car and caravan roofs, etc. In general, however, preference is given to the substrate being flexible. In that case a roll of thin film solar cell sheet is obtained which is ready for use and where sheets of the desired power and voltage can be cut off the roll. These can then be incorporated into (hybrid) roof elements or be applied onto tiles, roofing sheets, car and caravan roofs, etc., as desired.

If so desired, a top coat or surface layer may be provided on the TCO side of the solar cell to protect the TCO from outside influences. Generally, the surface layer will be a polymer sheet (with cavities if so desired) or a polymer film. The surface layer is required to have a high transmission and for instance comprises the following materials: amorphous (per)fluorinated polymers, polycarbonate, poly (methylmethacrylate), PET, PEN or any clear coating available, such as the ones used in the car industry. If so desired, an additional anti-reflection or anti-fouling layer may be provided. Alternatively, if so desired, the entire solar cell may be incorporated into such an encapsulant.

What is claimed is:

1. Method of manufacturing a photovoltaic foil comprising a TCO layer, a photovoltaic layer, and a back electrode, which method comprises the following steps:

providing a conductive temporary substrate applying a TOO layer on the temporary substrate applying a photovoltaic layer on the TCO by means of electrodeposition, with the current for the electrodeposition being supplied at least through the temporary substrate applying a back electrode removing the temporary substrate.

2. The method according to claim 1 in which the temporary substrate with the TCO provided thereon is led over a roller, with the current for the electrodeposition being supplied through said roller.

3. The method according to claim 1 in which the temporary substrate provided with the TCO is guided via at least one guiding role into an electrolyte bath containing an electrode, with the guiding role or roles also serving as electric contact for the foil.

4. The method according to claims 1 to 3 wherein one or more layers selected from the TCO layer, any electrically conductive buffer layers and the back electrode are also applied by way of electrodeposition with the current being supplied through the temporary substrate.

5. The method according to claim 4, wherein the TCO layer, any electrically conductive buffer layer, the photovoltaic layer and the back electrode are applied by way of electrodeposition in succession in a continuous process.

6. The method according to claim 5, wherein in a first step the temporary substrate is prepared by electrodeposition on a carrier, after which the TCO layer, any electrically conductive buffer layer, the photovoltaic layer and the back electrode are applied by way of electrodeposition in succession in a continuous process.

7. The method according to any one of the claims 1 to 3 wherein the temporary substrate is a metal foil.

8. The method according to any one of claims 1–3 wherein a buffer layer is provided between the TCO and the photovoltaic layer.

9. The method according to any one of claims 1 to 3 comprising the following steps:

providing a temporary substrate applying a TCO with grooves provided therein applying a photovoltaic layer on the TCO and the grooves provided therein by means of electrodeposition providing grooves or (rows of) holes in the photovoltaic layer next to the grooves in the TCO applying a back electrode provided with grooves next to the grooves (or rows of) holes in the photovoltaic layer removing the temporary substrate.

10. The method according to any one of claims 1 to 3 comprising the following steps:

providing a temporary substrate applying a TCO applying a photovoltaic layer by means of electrodeposition providing grooves or (rows of) holes in the photovoltaic layer applying a back electrode provided with grooves removing the temporary substrate providing grooves in the TCO.

11. The method according to any one of claims 1 to 3 which is carried out in a continuous process.

12. The method according to any one of claims 1 to 3 comprising application of a permanent substrate.

* * * * *

UNITED STATES PATENT AND TRADEMARK OFFICE
CERTIFICATE OF CORRECTION

PATENT NO.    : 6,951,770 B2                                              Page 1 of 1
DATED         : October 4, 2005
INVENTOR(S)   : Erik Middelman and Gert Jan Jongerden It is certified that error appears in the above-identified patent and that said Letters Patent is hereby corrected as shown below:

Column 8,
Line 13, change "TOO" to -- TCO --.

Signed and Sealed this

Thirteenth Day of December, 2005

JON W. DUDAS
*Director of the United States Patent and Trademark Office*

UNITED STATES PATENT AND TRADEMARK OFFICE
CERTIFICATE OF CORRECTION

PATENT NO.       : 6,951,770 B2  
APPLICATION NO. : 10/240632  
DATED            : October 4, 2005  
INVENTOR(S)      : Erik Middelman and Gert Jan Jongerden Page 1 of 1

It is certified that error appears in the above-identified patent and that said Letters Patent is hereby corrected as shown below:

Title page, in between items [(87)] and [(51)], insert a new item as follows:

Item --(30)    Foreign Application Priority Data  
April 6, 2000    (NL) ............................1014857--.

Signed and Sealed this

Seventh Day of April, 2009

JOHN DOLL  
*Acting Director of the United States Patent and Trademark Office*